United States Patent
Lin et al.

(10) Patent No.: US 7,397,667 B2
(45) Date of Patent: Jul. 8, 2008

(54) COOLER MODULE AND ITS FASTENING STRUCTURE

(75) Inventors: Chun-Hung Lin, Taipei (TW);
Tsung-Hui Wu, Taipei (TW);
Wei-Chung Hsiao, Taipei (TW);
Hsuan-Cheng Wang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 11/724,085

(22) Filed: Mar. 14, 2007

(65) Prior Publication Data
US 2007/0274049 A1 Nov. 29, 2007

(30) Foreign Application Priority Data
May 24, 2006 (TW) ................ 95118408 A

(51) Int. Cl.
*H05K 7/20* (2006.01)
*F28D 15/00* (2006.01)

(52) U.S. Cl. ............ 361/719; 361/700; 361/704; 165/104.33; 174/15.2

(58) Field of Classification Search ......... 361/699–704, 361/719; 29/890.032; 165/80.4–80.5, 104.33, 165/185; 174/15.2; 248/500, 505, 214; 269/329
See application file for complete search history.

(56) References Cited

U.S. PATENT DOCUMENTS

| 7,327,574 | B2 * | 2/2008 | Frank et al. ............... 361/711 |
| 2007/0236885 | A1 * | 10/2007 | Zhao et al. ............... 361/700 |
| 2007/0253769 | A1 * | 11/2007 | Hwang et al. ............ 403/326 |

* cited by examiner

*Primary Examiner*—Jayprakash N Gandhi
*Assistant Examiner*—Robert J Hoffberg
(74) *Attorney, Agent, or Firm*—Ming Chow; Sinorica, LLC

(57) ABSTRACT

A cooler module mounted on a CPU on a circuit board inside a computer is disclosed to include a mounting base frame, which is made of a thermal conductive material and has a heat-transfer zone disposed in contact with the CPU and two arms respectively extended from two sides of the heat-transfer zone and affixed to the circuit board and two eyelet lugs vertically extended from two sides of the distal end of one of the two arms, a heat pipe, which has one end supported on the heat-transfer zone of the mounting base frame, an elongated retaining member, which has two lugs disposed at one end thereof and respectively fastened to the eyelet lugs of the mounting base frame, and a buffer member fastened to the heat-transfer zone to hold down heat pipe on the heat-transfer zone.

14 Claims, 5 Drawing Sheets

COOLER MODULE AND ITS FASTENING STRUCTURE

BACKGROUND OF THE INVENTION

1. Field of the Invention

The present invention relates to a cooler module for cooling a thermal chip or the like and more particularly, to such a cooler module, which dissipates heat from the thermal chip and provides a buffer protection to the thermal chip. The invention also provides a cooler module fastening structure.

2. Description of the Related Art

During operation of an electronic apparatus, the internal chip will emit heat. For example, the CPU, VGA, southbridge chip, or northbridge chip of a computer will emit heat during operation of the computer. Further, following development of high-speed electronic devices, the emitted amount of heat of these high-speed electronic devices will be relatively increased During operation of an electronic apparatus, heat must be quickly carried away from the thermal chip. Accumulation of heat energy around the thermal chip will lower the performance of the thermal chip. Therefore, "cooling", in another world, "heat dissipation" is an important subject to manufacturers in this field.

A conventional cooler module for this purpose, as shown in FIG. 1, comprises a heat-transfer block C mounted on the thermal chip D, a heat sink A connected to the heat-transfer block C through the heat pipe B, and a holding down member E to hold down the heat-transfer block C mounted on the thermal chip D. The holding down member E has mounting holes disposed at two sides and respectively fastened to a respective column F at the circuit board that carries the thermal chip D.

This design of cooler module is functional, however it still has drawbacks. When one end of the holding down member is affixed to the circuit board that carries the thermal chip, the heat-transfer block C is formed to extend in one direction, giving a pressure to one corner edge of the thermal chip D obliquely. This pressure may damage the thermal chip D.

SUMMARY OF THE INVENTION

The present invention has been accomplished under the circumstances in view. It is one object of the present invention to provide a cooler module installed in a thermal chip inside a computer for dissipating heat from the thermal chip. The cooler module comprises a mounting base frame, a heat pipe, and an elongated retaining member. The mounting base frame is made of a thermal conductive material, having a heat-transfer zone disposed in contact with the thermal chip, two arms respectively extended from two sides of the heat-transfer zone and fastened to a circuit board carrying the thermal chip, and two lugs extended from one of the two arms at two opposite sides. The lugs of the mounting base frame each have an eyelet. The heat pipe has one end affixed to the heat-transfer zone of the mounting base frame. The elongated retaining member is adapted to hold down the heat pipe on the heat-transfer zone of the mounting base frame, having two lugs extended from one end thereof and respectively coupled to the eyelets of the lugs of the mounting base frame.

It is another aspect of the present invention to provide a cooler module fastening structure, which is installed in a thermal chip inside a computer to hold a heat pipe for dissipating heat from the thermal chip. The cooler module fastening structure comprises a mounting base frame and an elongated retaining member. The mounting base frame is made of a thermal conductive material, having a heat-transfer zone disposed in contact with the thermal chip, two arms respectively extended from two sides of the heat-transfer zone and fastened to a circuit board carrying the thermal chip, and two lugs extended from one of the two arms at two opposite sides. The lugs of the mounting base frame each have an eyelet. The elongated retaining member has two lugs extended from one end thereof and respectively fastened to the eyelets of the lugs of the mounting base frame to pivotally secure the elongated retaining member to the mounting base frame for allowing one end of the heat pipe to be held on the heat-transfer zone of the mounting base frame.

DETAILED DESCRIPTION OF THE PREFERRED EMBODIMENT

Figure 1:
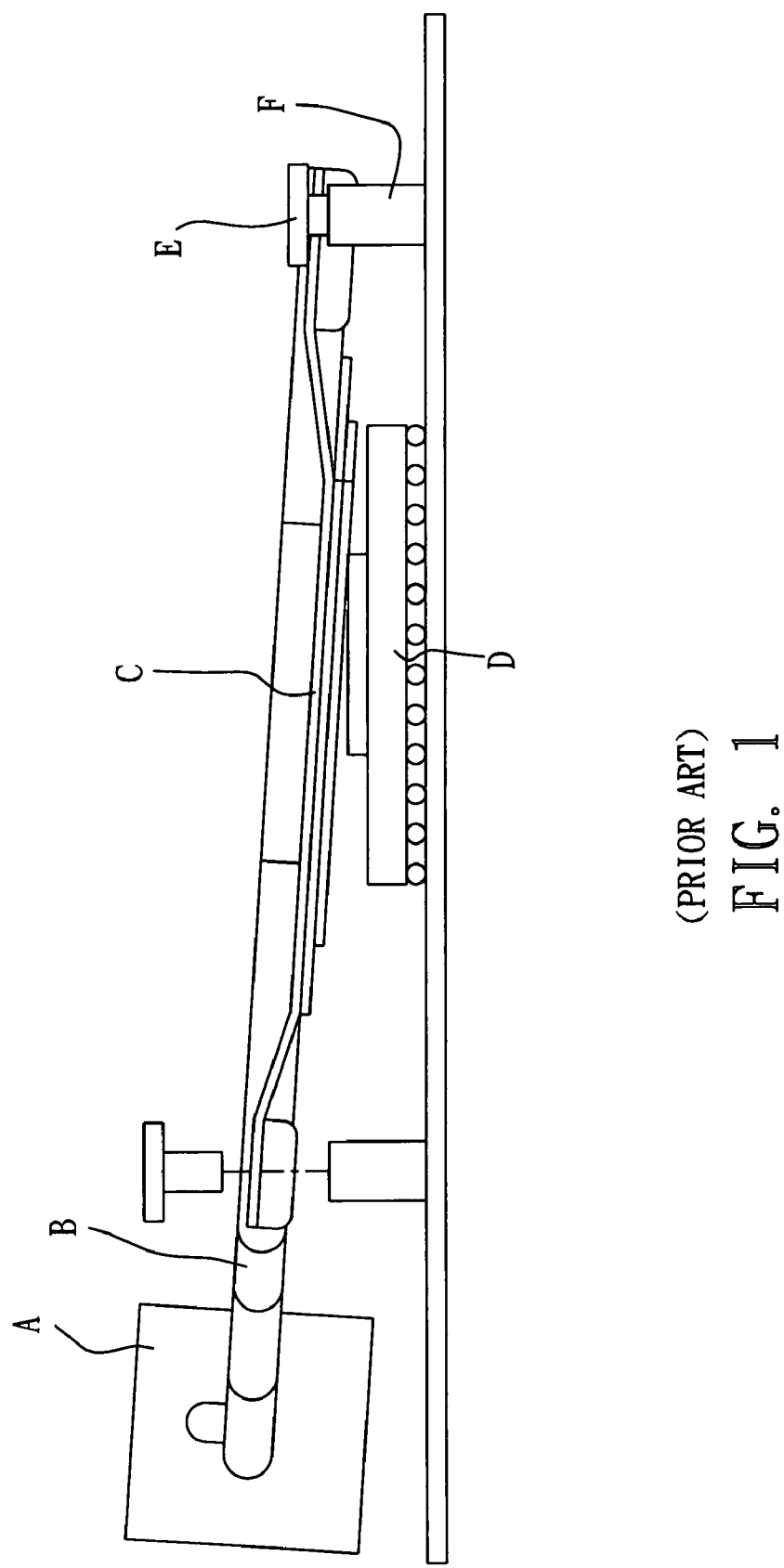
FIG. 1 is a schematic drawing illustrating a cooler module according to the prior art.
Figure 2:
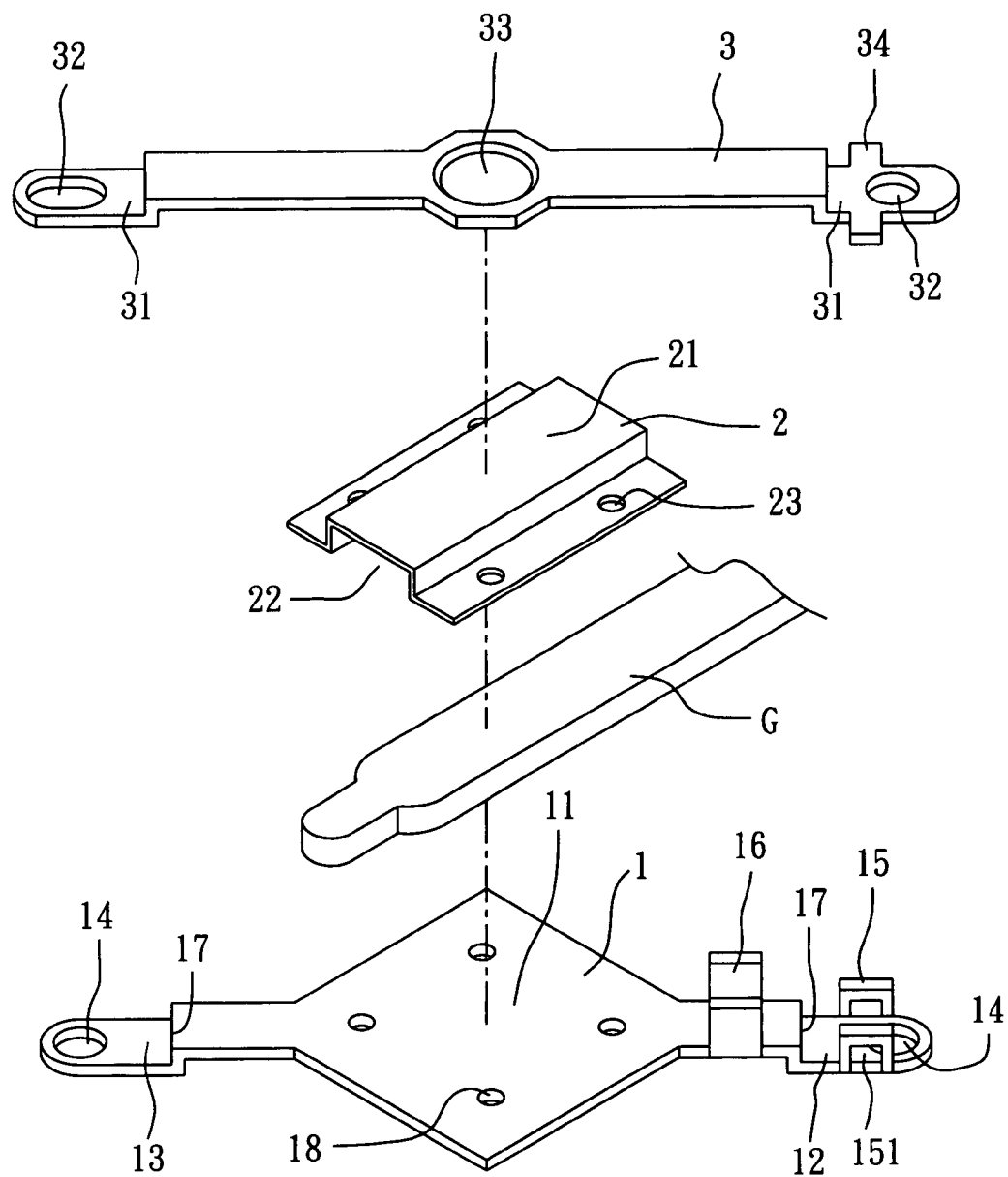
FIG. 2 is an exploded view of a cooler module in accordance with a first embodiment of the present invention.

Referring to FIG. 2, a cooler module in accordance with a first embodiment of the present invention is shown comprised of a mounting base frame 1, a buffer member 2, and a retaining member 3. The mounting base frame 1 is affixed to a heat pipe G.

The mounting base frame 1 is a plate member made of a thermal conductive material, for example, copper, having a heat-transfer zone 11, for example, rectangular shape, corresponding to the heat releasing area of the top side of a heat source, and two arms 12 and 13 respectively extended from two sides of the heat-transfer zone 11 and terminating in a respective mounting end hole 14 for fastening to a circuit board (not shown in the figure). The arm 12 has a coupling structure for detachably receiving one end of the retaining member 3. According to this embodiment, the coupling structure is comprised of two lugs 15 respectively vertically extended from two sides of the distal end of the arm 12. Each lug 15 has an eyelet 151. Further, two wings 16 provided at two sides of the arm 12 to limit horizontal displacement of the retaining member 3. Further, the arms 12 and 13 are zigzagged, each having a vertical step 17 between two horizontal halves thereof. Further, four mounting through holes 18 are respectively formed on the heat-transfer zone 11 near its four corners.

The buffer member 2 is set between the heat pipe G and the retaining member 3 to prevent direct contact of the retaining member 3 with the heat pipe G and to bear the pressure from the retaining member 3 and also to transfer heat. The buffer member 2 is made of a thermal conductive material, for example, copper, having a buffer body 21, which is shaped like a channel bar and defines a bottom receiving open chamber 22 for accommodating the heat pipe G, and a plurality of mounting through holes 23 arranged at two sides of the buffer body 21 corresponding to the mounting through holes 18 of the mounting base frame 1.

The retaining member 3 is a narrow elongated member bridging the mounting base frame 1 corresponding to the two arms 12 and 13, having two endpieces 31 respectively extended from the two distal ends thereof and curved vertically downward and then forward. Each endpieces 31 has a through hole 32 corresponding to the mounting end hole 14 on each of the two arms 12 and 13 of the mounting base frame 1. To provide a better holding down pressure to the buffer member 2, the center part of the retaining member 3 is stamped into a flat, circular bottom protrusion 33. The size of the bottom protrusion 33 is smaller than the width of the buffer body 21 of the buffer member 2. The bottom protrusion 33 may be kept in contact with the heat pipe G directly or indirectly, thereby imparting a downward pressure to the center area of the mounting base frame 1 against a thermal chip. For modularized installation, two lugs 34 are formed integral with one endpiece 31 at two sides when stamping the retaining member 3 into shape. The two lugs 34 are respectively fastened to the eyelets 151 of the lugs 15 of the mounting base frame 1. The part of the retaining member 3 corresponding to the wings 16 has a width smaller than the distance between the wings 16.

Figure 3:
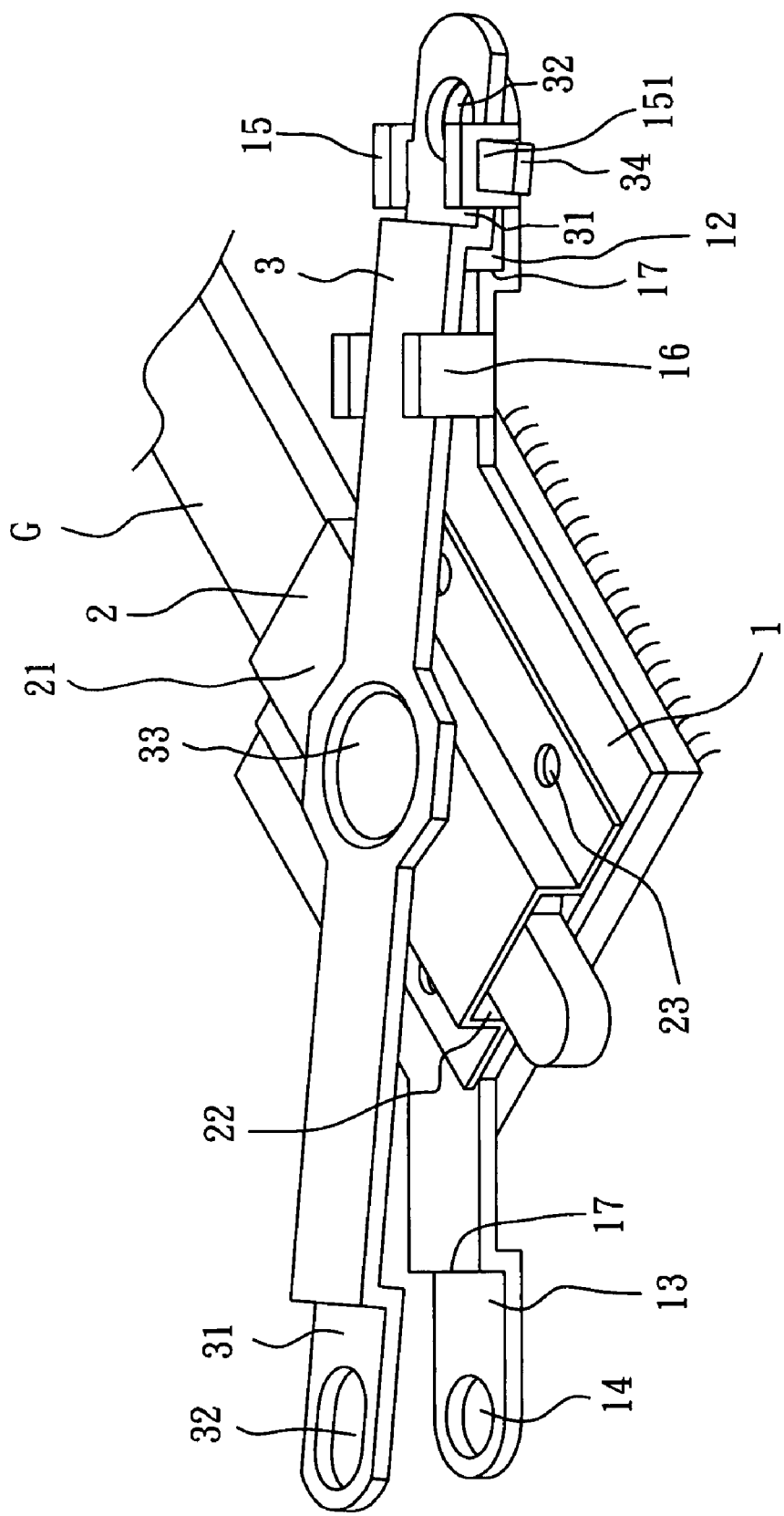
FIG. 3 is a schematic drawing showing installation of the cooler module according to the first embodiment of the present invention.

Referring to FIG. 3, the two lugs 34 of the retaining member 3 are respectively engaged into the eyelets 151 of the lugs 15 of the mounting base frame 1, and therefore the retaining member 3 is pivotally coupled to the mounting base frame 1. During installation, one end of the heat pipe G is received in the bottom receiving open chamber 22 of the buffer member 2. After the buffer member 2 is affixed to the mounting base frame 1, two screws (not shown) are respectively inserted through the through holes 32 of the retaining member 3 and the mounting end holes 14 of the mounting base frame 1 and threaded into a respective female at the thermal chip (not shown), keeping the heat-transfer zone 11 is positive contact with the thermal chip.

Thus, heat emitted by the thermal chip is transferred through the mounting base frame 1 to the heat pipe G while the buffer body 21 of the buffer member 2 bears the holding down pressure of the retaining member 3, preventing installation damage.

Figure 4:
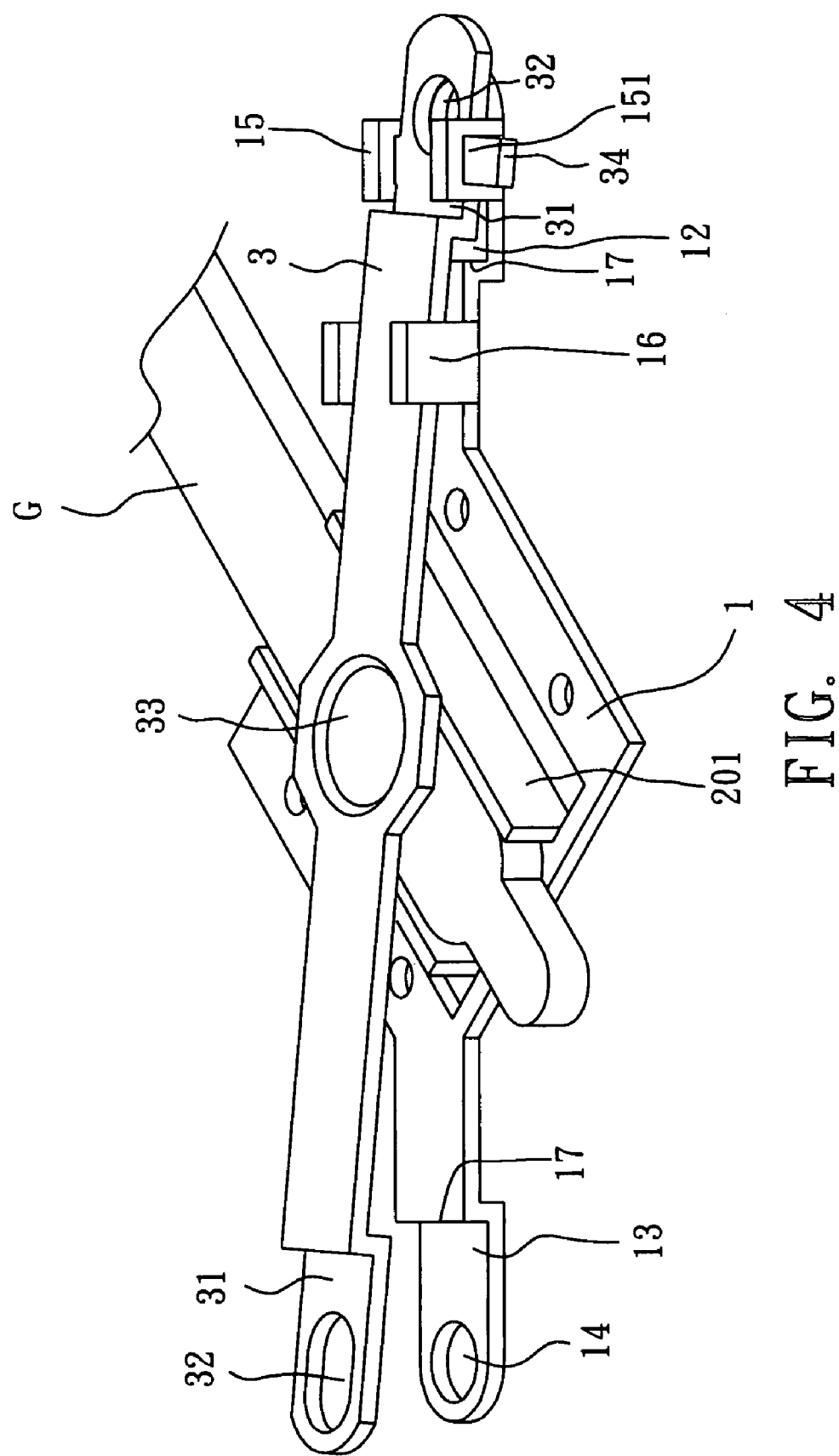
FIG. 4 is a schematic drawing showing installation of a cooler module in accordance with a second embodiment of the present invention.

FIG. 4 shows a second embodiment of the present invention. This embodiment eliminates the aforesaid buffer member 2. According to this embodiment, a part of the mounting base frame 1 is stamped to form two upright walls 201 that substitute for the aforesaid buffer member 2. The heat pipe G is supported on the mounting base frame 1 between the two upright walls 201. The upright walls 201 have a height not lower than the height of the heat pipe G. Therefore, the upright walls 201 bear the holding down pressure of the retaining member 3, preventing installation damage.

Figure 5:
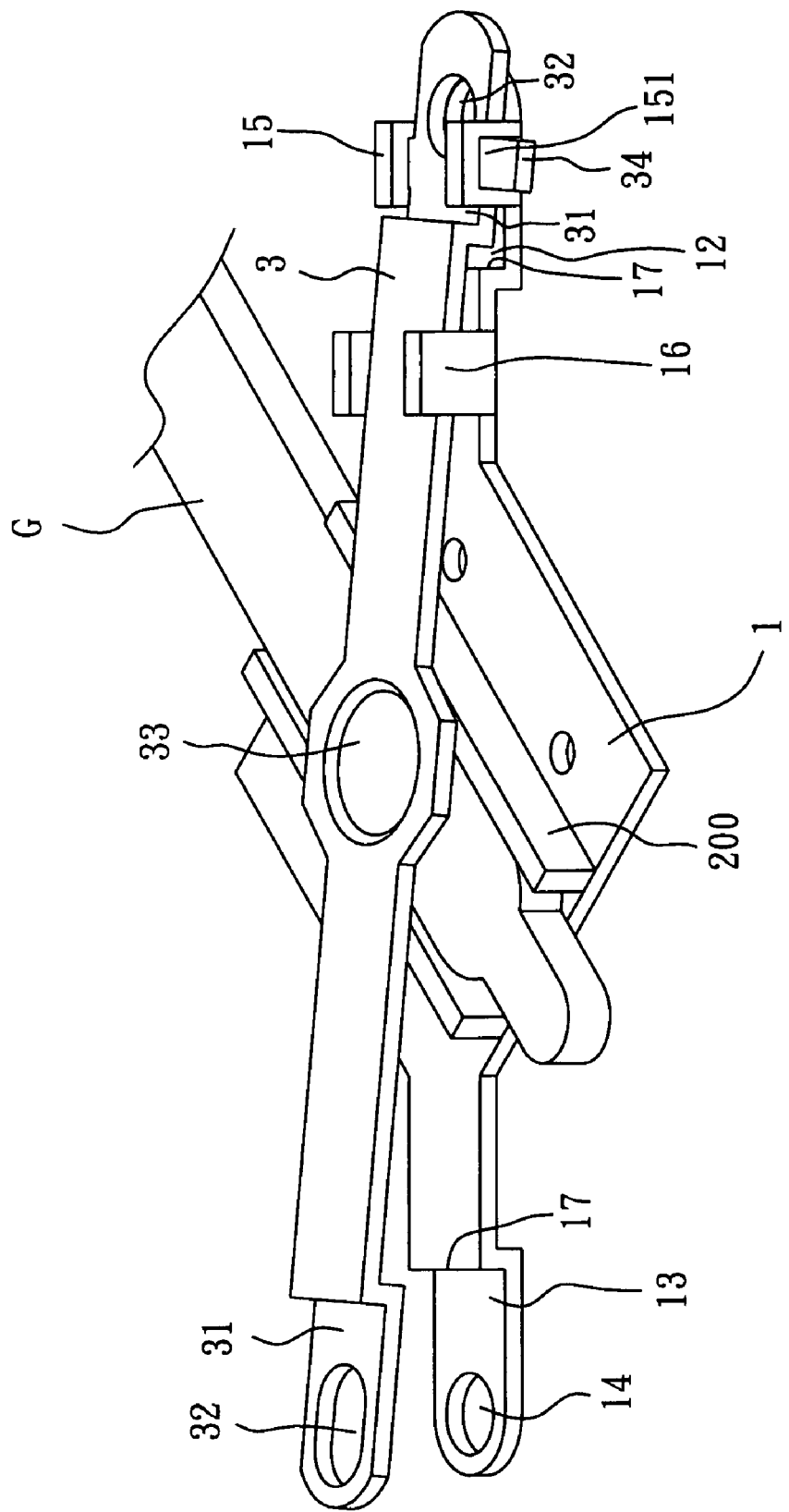
FIG. 5 is a schematic drawing showing installation of a cooler module in accordance with a third embodiment of the present invention.

FIG. 5 shows a third embodiment of the present invention. According to this embodiment, two upright stop blocks 200 are affixed to the mounting base frame 1 at two sides of the heat pipe G, achieving the same effect as the aforesaid buffer member.

Although a particular embodiment of the invention has been described in detail for purposes of illustration, various modifications and enhancements may be made without departing from the spirit and scope of the invention.

What is claimed is:

1. A cooler module installed in a thermal chip inside a computer for dissipating heat from said thermal chip, the cooler module comprising:
   a mounting base frame made of a thermal conductive material, said mounting base frame having a heat-transfer zone disposed in contact with said thermal chip, two arms respectively extended from two sides of said heat-transfer zone and fastened to a circuit board carrying said thermal chip, and a first pair of lugs extended from one of said two arms at two opposite sides, the first pair of lugs of said mounting base frame each having an eyelet;
   a heat pipe, said heat pipe having one end affixed to said heat-transfer zone of said mounting base frame; and
   an elongated retaining member adapted to hold down said heat pipe on said heat-transfer zone of said mounting base frame, said elongated retaining member having a second pair of lugs extended from one end thereof and respectively coupled to the eyelets of the first pair of lugs of said mounting base frame.

2. The cooler module as claimed in claim 1, further comprising buffer means provided at said heat-transfer zone of said mounting base frame to hold said heat pipe on said heat-transfer zone of said mounting base frame.

3. The cooler module as claimed in claim 1, wherein the two arms of said mounting base frame each have a mounting end hole; said elongated retaining member has two mounting through holes respectively disposed at two distal ends thereof and respectively fastened to the mounting end holes of said mounting base frame and said circuit board.

4. The cooler module as claimed in claim 2, wherein said buffer means comprises two stop blocks affixed to a top side of said heat-transfer zone of said mounting base frame at two sides of said heat pipe.

5. The cooler module as claimed in claim 2, wherein said buffer means comprises two upright walls formed on a part of said heat-transfer zone of said mounting base frame to hold said heat pipe on said heat-transfer zone between said two upright walls.

6. The cooler module as claimed in claim 2, wherein said buffer means comprises a plate member affixed to said heat-transfer zone of said mounting base frame, having a buffer body shaped like a channel, said buffer body defining a bottom receiving open chamber that accommodates said heat pipe.

7. The cooler module as claimed in claim 1, wherein said elongated retaining member has a flat bottom protrusion protruded downwards from a center part thereof and adapted to hold down said heat pipe on said heat-transfer zone of said mounting base frame.

8. A cooler module fastening structure installed in a thermal chip inside a computer to hold a heat pipe for dissipating heat from said thermal chip, said cooler module fastening structure comprising:
   a mounting base frame made of a thermal conductive material, said mounting base frame having a heat-transfer zone disposed in contact with said thermal chip, two arms respectively extended from two sides of said heat-transfer zone and fastened to a circuit board carrying said thermal chip, and a first pair of lugs extended from one of said two arms at two opposite sides, the first pair of lugs of said mounting base frame each having an eyelet; and
   an elongated retaining member, said elongated retaining member having a second pair of lugs extended from one end thereof and respectively fastened to the eyelets of the first pair of lugs of said mounting base frame to pivotally secure said elongated retaining member to said mounting base frame for allowing one end of said heat pipe to be held on said heat-transfer zone of said mounting base frame.

9. The cooler module fastening structure as claimed in claim 8, further comprising buffer means provided at said heat-transfer zone of said mounting base frame to hold said heat pipe on said heat-transfer zone of said mounting base frame.

10. The cooler module fastening structure as claimed in claim 8, wherein the two arms of said mounting base frame each have a mounting end hole; said elongated retaining member has two mounting through holes respectively disposed at two distal ends thereof and respectively fastened to the mounting end holes of said mounting base frame and said circuit board.

11. The cooler module fastening structure as claimed in claim 9, wherein said buffer means comprises two stop blocks affixed to a top side of said heat-transfer zone of said mounting base frame at two sides of said heat pipe.

12. The cooler module fastening structure as claimed in claim 9, wherein said buffer means comprises two upright walls formed on a part of said heat-transfer zone of said mounting base frame to hold said heat pipe on said heat-transfer zone between said two upright walls.

13. The cooler module fastening structure as claimed in claim 9, wherein said buffer means comprises a plate member affixed to said heat-transfer zone of said mounting base frame, having a buffer body shaped like a channel, said buffer body defining a bottom receiving open chamber that accommodates said heat pipe.

14. The cooler module fastening structure as claimed in claim 8, wherein said elongated retaining member has a flat bottom protrusion protruded downwards from a center part thereof and adapted to hold down said heat pipe on said heat-transfer zone of said mounting base frame.

\* \* \* \* \*